(12) United States Patent
Chakraborty et al.

(10) Patent No.: US 11,164,088 B2
(45) Date of Patent: *Nov. 2, 2021

(54) INTERACTIVE FEEDBACK AND ASSESSMENT EXPERIENCE

(71) Applicant: International Business Machines Corporation, Armonk, NY (US)

(72) Inventors: Srirupa Chakraborty, Ona, WV (US); Payel Das, Yorktown Heights, NY (US); Aditya Vempaty, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 947 days.

This patent is subject to a terminal disclaimer.

(21) Appl. No.: 15/796,099

(22) Filed: Oct. 27, 2017

(65) Prior Publication Data

US 2019/0130284 A1   May 2, 2019

(51) Int. Cl.
*G06N 5/02*   (2006.01)
*G06N 7/00*   (2006.01)

(52) U.S. Cl.
CPC ............ *G06N 5/022* (2013.01); *G06N 7/005* (2013.01)

(58) Field of Classification Search
CPC .............................. G06N 5/022; G06N 7/005
See application file for complete search history.

(56) References Cited

U.S. PATENT DOCUMENTS

| 5,816,105 | A | * | 10/1998 | Adelstein | ................. | B25J 13/02 74/471 XY |
|---|---|---|---|---|---|---|
| 6,028,593 | A | | 2/2000 | Rosenberg et al. | | |
| 8,395,626 | B2 | | 3/2013 | Millman | | |

(Continued)

FOREIGN PATENT DOCUMENTS

WO    2015135042    9/2015

OTHER PUBLICATIONS

Davis et al., Image-Space Modal Bases for Plausible Manipulation of Objects in Video, ACM Transactions on Graphics, vol. 34, No. 6, Article 239, Nov. 2015, pp. 1-7.

(Continued)

*Primary Examiner* — George Giroux
(74) *Attorney, Agent, or Firm* — Lieberman & Brandsdorfer, LLC

(57) ABSTRACT

Sensory input data signal is communicated to an AI platform and translated into a corresponding scenario. The translation is directed at an associated force and application of the force to a selected or identified object and environment. Real-time analysis of the force is applied, which includes modeling an expected behavior. An assessment response is received and compared to a corpus. A solution in the corpus proximal to the assessment response is identified, and a reaction of proximity of the response to the identified solution is created. Proximity data is converted to a sensory output signal. Receipt of the sensory output signal by a corresponding sensory output device creates a physical manifestation of generated feedback of the reaction data to a sensory (Continued)

medium. Embodiments are directed at both learning and assessment, and leverage a corpus with the AI platform in support of an interactive learning experience.

18 Claims, 12 Drawing Sheets

(56) References Cited

U.S. PATENT DOCUMENTS

| | | | | |
|---|---|---|---|---|
| 8,645,112 | B2* | 2/2014 | Falash | G09B 9/00 |
| | | | | 703/6 |
| 8,751,204 | B2* | 6/2014 | Falash | G09B 9/00 |
| | | | | 703/6 |
| 8,814,691 | B2 | 8/2014 | Haddick et al. | |
| 9,274,595 | B2 | 3/2016 | Reitan | |
| 10,354,397 | B2* | 7/2019 | Davis | G06T 13/80 |
| 10,520,378 | B1* | 12/2019 | Brown | A61B 5/11 |
| 2015/0309316 | A1 | 10/2015 | Osterhout et al. | |
| 2016/0035132 | A1 | 2/2016 | Shuster et al. | |
| 2016/0049005 | A1* | 2/2016 | Mullins | G06K 9/66 |
| | | | | 345/420 |
| 2017/0323485 | A1 | 11/2017 | Samec et al. | |
| 2018/0045963 | A1* | 2/2018 | Hoover | G06F 3/011 |
| 2019/0096035 | A1 | 3/2019 | Li et al. | |

OTHER PUBLICATIONS

Anonymous, Interaction Discovery Using a Social Mobile Application, ip.com, IPCOM000226834D, Apr. 22, 2013, pp. 1-22.

Anonymous, A System for Optimizing Space Utilization in Virtual Reality Arenas, ip.com, IPCOM000243916D, Oct. 28, 2015, pp. 1-6.

Anonymous, Cognitive System and Method to Identify Symptoms and Patterns of Possible Harmful Virtual Interaction to the Psychological Integrity of Participants, ip.com, IPCOM000246122D, May 10, 2016, pp. 1-7.

Taunay et al., Interaction Techniques for Laymen in Immersive Virtual Reality, IHC 2014 Proceedings—Short Paper, PR, Brazil, pp. 1-4.

List of IBM Patents or Applications Treated as Related, Oct. 2017.

Davis, Abe, et al., "Image-Space Modal Bases for Plausible Manipulation of Objects in Video", ACM Transactions on Graphics, vol. 34, No. 6, Article 239, Nov. 2015.

Picinali, L., et al., "Exploration of architectural spaces by blind people using auditory virtual reality for the aonstruction of spatial knowledge", International Journal of Human Computer Studies, 72, pp. 393-407, 2014.

Chu, Chi-Cheng P., et al., "Multi-sensory user interface for a virtual-reality-based computer-aided design system", Computer-Aided Design, vol. 29, No. 10, pp. 709-725, 1997.

* cited by examiner

INTERACTIVE FEEDBACK AND ASSESSMENT EXPERIENCE

BACKGROUND

The present embodiments relate to simulation on a virtual platform. More specifically, the embodiments relates to an artificial intelligence platform to incorporate sensory input and output for an interactive learning experience.

The act of simulation is directed at assuming an appearance of an object or subject. A simulation may be employed in a virtual environment to produce a computer model of the subject. For example, a computer simulation may use a computer to represent a response from one system based upon the behavior of another system after which it is modeled. The simulation uses a mathematical description, or model, of a real system in the form of a computer program. For example, computer programs may be utilized to encompass characteristics of the behavior of the system. In one embodiment, computer simulations are used to study dynamic behavior in an environment that would be challenging in a real-world application. Accordingly, the computer simulation is a form of a computer program that attempts to simulate an abstract model of a particular system.

Despite advantages that may be attached with the use of a simulation, simulators, like most tools, have their drawbacks. Many of these drawbacks can be attributed to computationally intensive processing required by some simulators. As a consequence, the results of the simulation may not be readily available after the simulation has started. For example, an event that may occur instantaneously in the real world may actually take hours to mimic in a simulated environment. The delays may be due to an exceedingly large number of entities being simulated or due to the complex interactions that occur between the entities within the system being simulated. Accordingly, simulators are restricted by limited hardware platforms which frequently cannot meet the computational demands of the simulator.

SUMMARY

The embodiments include a system, computer program product, and method for simulating object interaction through leveraging an artificial intelligence platform.

In one aspect, a system is provided for use with an intelligent computer platform for simulating real-world interaction with a physical object. A processing unit is operatively coupled to memory and is in communication with an artificial intelligence platform. A knowledge engine, in communication with the processing unit, is activated by the artificial intelligence platform and employed to simulate interaction of an object with sensory input data. The object that is the subject of the simulation is selected, and sensory input data is received from a sensory input device. The sensory input data is translated into a force and applied to the object. This application includes converting the translated force into magnitude and direction. In real-time the artificial intelligence platform analyzes the force as it is applied to the object and models an expected behavior of the object. One or more characteristics of the object with the applied force are captured and an assessment commensurate with the model is created. The assessment is presented and a corresponding assessment response is received. The corpus of solutions is consulted as a source for evaluation of the assessment. Each solution includes an entry of force magnitude and an object parameter. At least one solution in the corpus determined to be proximal to the assessment response is identified. Sensory feedback data is generated for the comparison in the form of a translation of proximity of the assessment response to the solution identified in the corpus. The response proximity is translated to a sensory feedback signal to physically convey a manifestation of the generated feedback to a corresponding sensory medium.

In another aspect, a computer program device is provided to support sensory data in an intelligent computer platform. The device has program code embodied therewith. The program code is executable by a processing unit to select an object for assessment and receive sensory input data from a sensory input medium, the sensory input data to be applied to the selected object. Program code translates the sensory input data into a force and applies the force to the selected object. The application further includes program code to convert the received sensory input data into both magnitude and direction of the force. In real-time, program code analyzes the force as it is applied to the object, and models an expected behavior of the object. One or more characteristics of the object with the applied force are captured and an assessment commensurate with the model is created. The assessment is presented and a corresponding assessment response is received. The corpus of solutions is consulted as a source for evaluation of the assessment. Each solution includes an entry of force magnitude and an object parameter. The program code determines or otherwise identifies at least one solution in the corpus as being proximal to the assessment response. Program code generates sensory feedback data for the comparison in the form of a translation of proximity of the assessment response to the solution identified in the corpus. The response proximity is translated to a sensory feedback signal to physically convey a manifestation of the generated feedback to a corresponding sensory medium.

In yet another aspect, a method is provided for use by an intelligent computer platform for supporting sensory data. The method selects an object for assessment and receives sensory input data from a sensory input device to be applied to the selected object. The sensory input data is translated into a force, which includes converting the force into both magnitude and direction. In real-time the force is analyzed as it is applied to the object and models an expected behavior of the object. One or more characteristics of the object with the applied force are captured and an assessment commensurate with the model is created. The assessment is presented and a corresponding assessment response is received. The corpus of solutions is consulted as a source for evaluation of the assessment. Each solution includes an entry of force magnitude and an object parameter. At least one solution in the corpus determined to be proximal to the assessment response is identified. Sensory feedback data is generated for the comparison in the form of a translation of proximity of the assessment response to the solution identified in the corpus. The response proximity is translated to a sensory feedback signal to physically convey a manifestation of the generated feedback to a corresponding sensory medium.

These and other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The drawings reference herein forms a part of the specification. Features shown in the drawings are meant as illustrative of only some embodiments, and not of all embodiments, unless otherwise explicitly indicated.

DETAILED DESCRIPTION

It will be readily understood that the components of the present embodiments, as generally described and illustrated in the Figures herein, may be arranged and designed in a wide variety of different configurations. Thus, the following details description of the embodiments of the apparatus, system, method, and computer program product of the present embodiments, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiments. Thus, appearances of the phrases "a select embodiment," "in one embodiment," or "in an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

In the field of education, it is understood and recognized that different people have different learning styles and manners of retaining knowledge. Virtual platforms have become common for education. For example, a physical scenario may be modeled via computer program instructions to represent a real-world experience. The modeling may be recorded and available for viewing across a computer platform. However, this form of modeling does not support or enable physical representation to teach interactivity with a real-world experience. At the same time, to experience the physical representation may be expensive, or at times not available. Accordingly, there is a need to expand the virtual platform representation to support sensory input and/or output.

Figure 1:
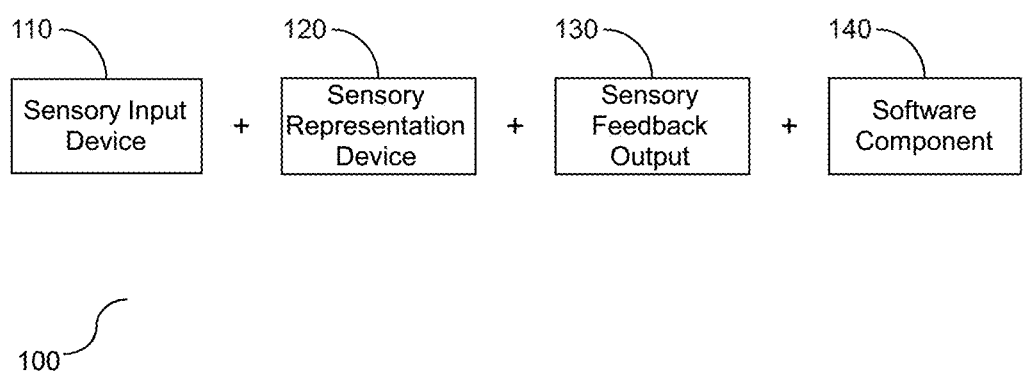
FIG. 1 depicts a system diagram illustrating a content and response system connected in a network environment that uses a knowledge engine to identify and analyze physical forces related to sensory input.

Referring to FIG. 1, a diagram (100) is provided to depict an abstract representation of the system components. As shown, there are three hardware components, including a sensory input device (110), a sensory representation device (120), and a sensory output device (130). In addition, there is a software component, (140) for scenario modeling. The software component (140) is in communication with both the sensory input and output devices (110) and (130), respectively. More specifically, the software component quantifies, or otherwise converts the sensory input (110) to a corresponding value, and incorporates the quantified value into the representation (120). Output from the representation is quantified and converted to a sensory medium by the software component (140). The sensory output device (130) communicates the quantified representation via a sensory output medium.

Sensory processing refers to the ability to interpret sensory stimuli from a sensory modality. The stimuli may be directed, but not limited to, vision, hearing, tactile, olfactory, etc. The sensory input device (110) is configured to receive input directed from a specific modality, or a combination of two or more modalities. For example, the input device (110) may be an eye-tracking device to select an object, and a pressure-based touch sensor to convey force input to the selected object. Measurement of sensory input is ascertained from the input device (110) and communicated to the software component (140). In one embodiment, the measurement from the input device (110) is an estimate of the physical force, e.g. magnitude and direction, to be simulated on a selected or designated object. For example, in one embodiment the estimation is a function of the input sensor, such as the duration and magnitude of the sensory input. Physical characteristics of the selected object together with the estimated physical force(s) are used to model expected behavior. In one embodiment, physics based theories are utilized for the object modeling. Similarly, in one embodiment, the modeling is conveyed through the multi-sensory representation hardware (120). At the same time, the behavior of the selected object and associated force are modeled and conveyed to the sensory output device (130). One or more sensory feedback sensors are utilized as part of the output device (130) to communicate an experience of the modeled behavior. For example, in one embodiment, a haptic feedback sensor models the effect of the modeled force on the selected object. Accordingly, a combination of hardware and software components are utilized to model physical forces based on sensory input to provide sensory output to convey reactivity to the modeled physical forces.

Figure 2:
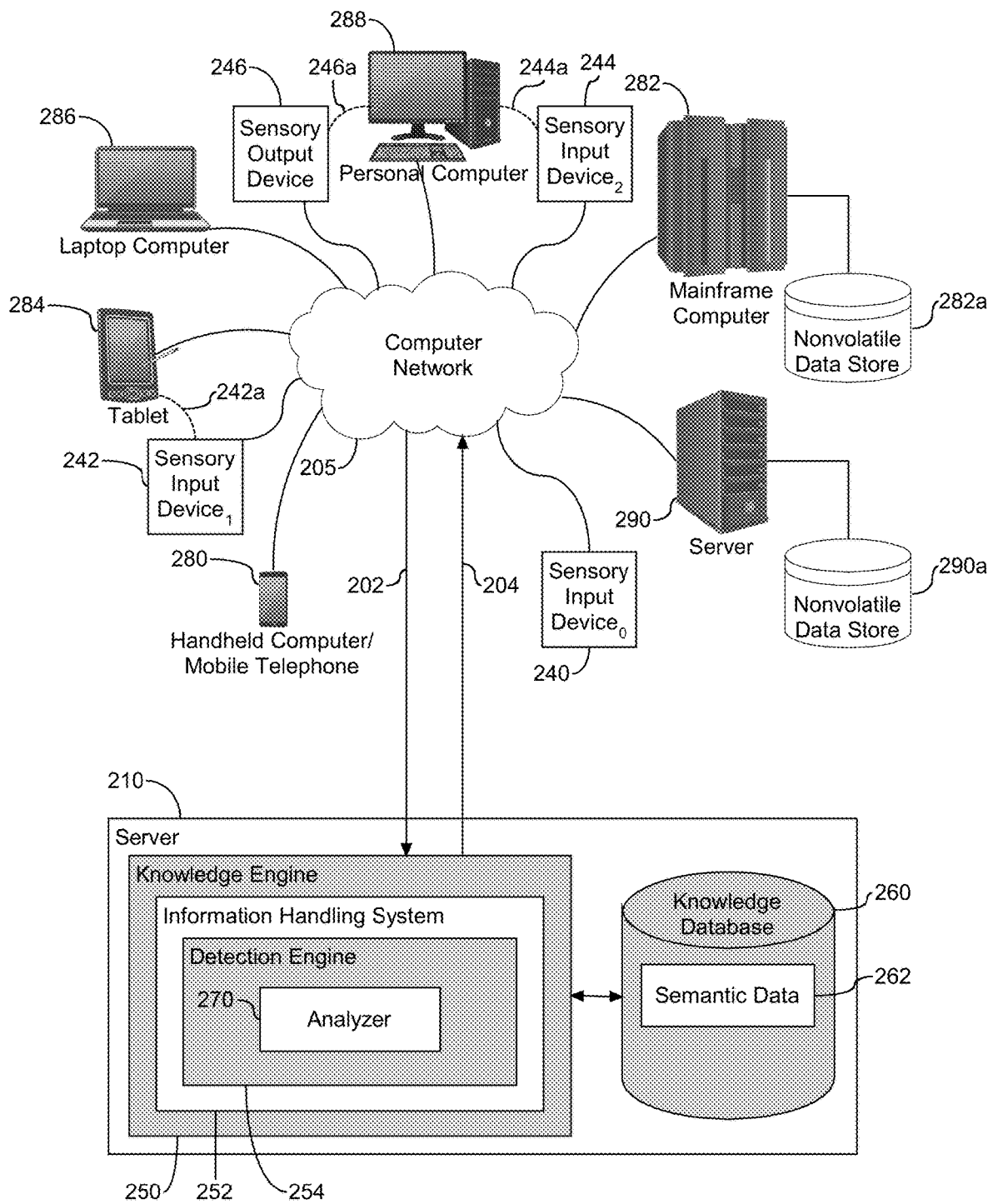
FIG. 2 depicts a schematic diagram of an artificial intelligence system.

Referring to FIG. 2, a schematic diagram of an artificial intelligence system (200) is depicted. As shown, a server (210) is provided in communication with a plurality of computing devices (280), (282), (284), (286), and (288) across a network connection (205). The server (210) is configured with a processing unit in communication with memory across a bus. The server (210) is shown with a knowledge engine (250) for sensory processing and modeling over the network (205). As shown, one or more sensory input devices (240), (242), and (244) are shown operatively coupled to the network (205). One or more computing devices (280), (282), (284), (286) and (288) are also shown operatively coupled to the network (205). In one embodiment, one or more of the sensory input devices (240)-(244) may be locally coupled to one or more of the computing devices (280)-(288), as shown as (242a) and (244a). The computing devices (280), (282), (284), (286), and (288) communicate with each other and with other devices or components via one or more wired and/or wireless data communication links, where each communication link may comprise one or more of wires, routers, switches, transmitters, receivers, or the like. In this networked arrangement, the server (210) and the network connection (205) may enable sensory processing and modeling for one or more content users. Other embodiments of the server (210) may be used with components, systems, sub-systems, and/or devices other than those that are depicted herein.

The knowledge engine (250) is configured to receive input from various sources. For example, knowledge engine (250) may receive input from the network (205), one or more knowledge bases of corpus (260) of semantic data (262), or other data, content users, and other possible sources of input. In selected embodiments, the knowledge base (260) also referred to herein as corpus, may include structured, semi-structured, and/or unstructured content that are contained in one or more large knowledge databases or corpus. The various computing devices (280), (282), (284), (286), and (288) in communication with the network (205) may include access points for content creators and content users. Some of the computing devices may include devices for a database storing the corpus of data as the body of information used by the knowledge engine (250) to generate a simulation and an outcome across communication channel (204). The network (205) may include local network connections and remote connections in various embodiments, such that the knowledge engine (250) may operate in environments of any size, including local and global, e.g. the Internet. Additionally, the knowledge engine (250) serves as a front-end system that can make available a variety of knowledge extracted from or represented in documents, network accessible sources and/or structured data sources. In this manner, some processes populate the knowledge engine (250) with the semantic data (262) also including input interfaces to receive requests and respond accordingly.

As shown, content may be in the form of semantic data (262) for use as part of the corpus (260) of data with the knowledge engine (250). The corpus (260) may include any structured and unstructured documents, including but not limited to any file, text, article, or source of data (e.g. scholarly articles, dictionary, definitions, encyclopedia references, and the like) for use by the knowledge engine (250). Content users may access the knowledge engine (250) via a network connection or an internet connection to the network (205), and may submit data to the knowledge engine (250) that may effectively determine an outcome of a simulation scenario by searching content in the corpus of data. As further described below, when a process evaluates semantic content related to the sensory input, the process can use a variety of conventions to query content from the knowledge engine (250). In one embodiment, semantic content is content based on the factual data ascertained via scientific principles. The semantic content may also interpret an expression, such as by using Natural Language (NL) processing. In one embodiment, the process sends content across an input communication channel (202) to the knowledge engine (250), so that the content may be interpreted and the knowledge engine (250) may provide a response in the form of one or more outcomes across the outcome communication channel (204).

In some illustrative embodiments, server (210) may be the IBM Watson® system available from International Business Machines Corporation of Armonk, New York, which is augmented with the mechanisms of the illustrative embodiments described hereafter. The IBM Watson® knowledge manager system may receive input content (202), which in one embodiment may be from a sensory input device (240)-(244), which it then parses to extract the major features of the content that in turn are then applied to the corpus of data stored in the knowledge base (260). Based on application of the content to the corpus of data, a candidate model and expected behavior is generated by looking across the corpus of data for portions of the corpus of data that have potential for containing a matching outcome to the submitted content.

In particular, received content may be processed by the IBM Watson® server (210) which performs analysis on the scenario being modeled and the magnitude of the input content in each of the portions of the corpus of data found during application of the content using a variety of reasoning algorithms. There may be multiple reasoning algorithms applied, each of which performs different analysis, e.g., comparisons, and generates a score. For example, one or more reasoning algorithms may look at the matching of parameters of the scenario, such as the object that is the subject of the scenario, within the input content and the found portions of the corpus of data. Other reasoning algorithms may look at temporal or spatial features in the scenario, while others may evaluate the source of the portion of the corpus of data and evaluate its veracity.

Scores obtained from the various reasoning algorithms indicate the extent to which the potential response is inferred by the input content based on the specific area of focus of that reasoning algorithm. Each resulting score is weighted against a statistical model. The statistical model may be used to summarize a level of confidence that the IBM Watson® system has regarding the evidence that the potential response (204), i.e., candidate sensory output data, is inferred by the submitted content. This process may be repeated for each of the candidate outcomes until the IBM Watson® system (210) identifies candidate outcomes that surface as being significantly stronger than others and thus, generates a final outcome, or ranked set of outcomes, for the input content.

To process sensory input data, the system (210) may include an information handling system (252) which uses a detection engine (254) to translate the sensory input data and convert the input data into one or more physical parameters. Though shown as being embodied in or integrated with the server (210), the information handling system (252) and/or detection engine (254) may be implemented in a separate computing system (e.g., 290) that is connected across network (205) to the server (210). Wherever embodied, the detection engine (254) detects and categorizes sensory input data, one or more scenarios for application of the input data, including object characteristics and metadata, and identifies a best solution for the detected input data and scenario by modeling based on the characteristic metadata.

In selected example embodiments, the detection engine (254) may include an analyzer (270) that is configured to model an expected behavior of a selected object as it is exposed to the input data. As described herein, the input data is applied to a selected or identified object. Characteristics of the object, and in one embodiment, an associated environment where the object is contained, are stored in the corpus. The knowledge base (260), and specifically the semantic data (262), includes object and associated parameter data. As described in more detail with reference to FIGS. 3-9, the analyzer (270) may perform a structure analysis as related to physical parameters of the object, and in one embodiment associated environment data. The analyzer (270) may also be configured to apply one or more learning methods to match a detected pattern to known patterns to decide and categorize the object.

As shown, the detection engine (254) employs a subengine in the form of the analyzer (270) to support resolution of the modeled object. The analyzer (270) models a force from the sensory input as it is applied to the object, and generates feedback data. In one embodiment, the created model represents a combination of different forces. The analyzer (270) converts the generated feedback data to a selected sensory medium, as identified by the detection engine (254). For example, in one embodiment, the sensory platform for the feedback data is the same as the sensory input platform. As shown at (246), a sensory output device is shown coupled to the network (205) and separately coupled to the computing device (288) at (246a). In one embodiment, one or more of the sensory input devices (240)-(244) may function as a corresponding sensory output device. Similarly, in one embodiment, the sensory output platform may be different than the sensory input platform. The knowledge engine (250) communicates the feedback data to an identified sensory output device (240)-(244) across the outcome communication channel (204).

To evaluate which of the potential outcomes best corresponds to the selected object and/or environment and the detected sensor data, the detection engine (254) may be configured to use the definitions of the object and/or environment to determine and score potential combinations based on the options from the object and/or environment scenario alignments when combined. For example, the detection engine (254) may utilize the analyzer (270) for identifying appropriate scientific principles and physical properties, and applying an outcome analysis to look at the object-environment-input data relationships. The analyzer (270) may apply a learning method for previous similar object-environment-input relationships in a similar combination. The combination together with a target outcome may be presented to the corpus (260) for evidence from the characteristics and any corpus references that are used to help the determination.

The analyzer (270) searches the corpus (260) for evidence of the scientific principles and the sensory input data. The analyzer (270) applies a score according to its incidence in the corpus (260). An outcome for the analyzer (270) is in the form of output data that matches or closely matches the submitted input as applied to the selected object. The outcome may be based on a scoring applied to two or more matches in the corpus, and in one embodiment, an associated ranking of a plurality of potential outcomes.

Types of devices that can utilize system (210) range from small handheld devices, such as handheld computer/mobile telephone (280) to large mainframe systems, such as mainframe computer (282). Examples of handheld computer (280) include personal digital assistants (PDAs), personal entertainment devices, such as MP4 players, portable televisions, and compact disc players. Other examples of information handling systems include pen, or tablet, computer (284), laptop, or notebook, computer (286), personal computer system (288), and server (290). Similarly, input devices that can utilize system (210), includes, but are not limited to haptic, acoustic and visual input devices (240), (242), and 244), respectively. The input devices (240)-(244) may be locally couples to one or more of the devices (280)-(288), or coupled to the network (205). As shown, the various devices (240)-(244) and (280)-(288) can be networked together using computer network (205). Types of computer network (205) that can be used to interconnect the various information handling systems include Local Area Networks (LANs), Wireless Local Area Networks (WLANs), the Internet, the Public Switched Telephone Network (PSTN), other wireless networks, and any other network topology that can be used to interconnect the information handling systems. Many of the devices utilize data and data storage devices, such as nonvolatile data stores, such as hard drives and/or nonvolatile memory. Some of the devices may use separate nonvolatile data stores (e.g., server (290) utilizes nonvolatile data store (290a), and mainframe computer (282) utilizes nonvolatile data store (282a)). The nonvolatile data store (282a) can be a component that is external to the various information handling systems or can be internal to one of the information handling systems. An illustrative example of an information handling system showing an exemplary processor and various components commonly accessed by the processor is shown and described in FIG. 3.

Figure 3:
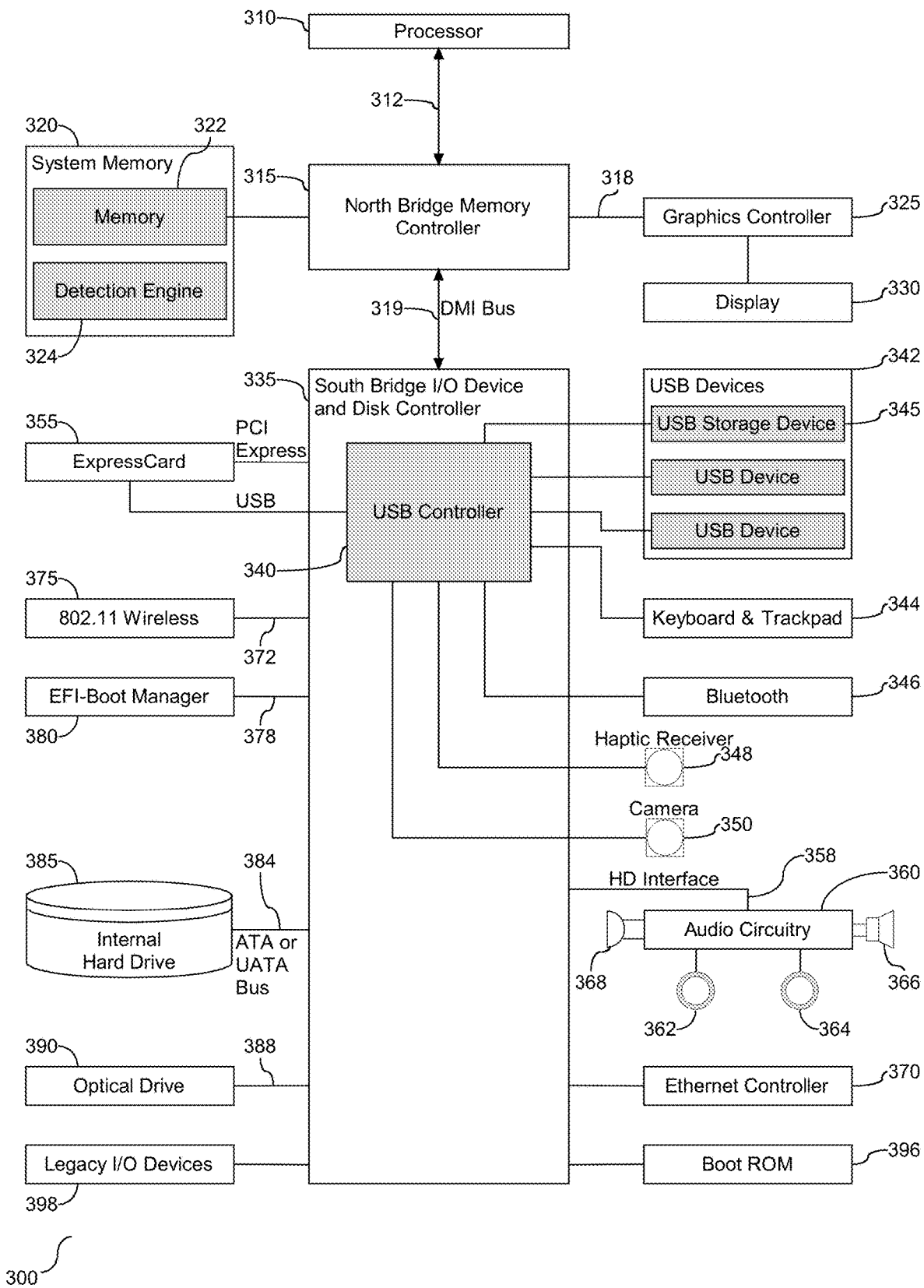
FIG. 3 depicts a block diagram illustrating a schematic representation of the artificial intelligence system.

Referring to FIG. 3, a block diagram (300) is provided illustrating a schematic representation of the artificial intelligence system. As shown, one or more processors (310) are coupled to processor interface bus (312), which connects processors (310) to Northbridge (315), which is also known as the Memory Controller Hub (MCH). Northbridge (315) connects to system memory (320) and provides a means for processor(s) (310) to access the system memory (320). In the system memory (320), a variety of programs may be stored in one or more memory devices, including a detection engine (324) which may be invoked to detect sensory input and to translate impact of the detected input. Graphics controller (335) also connects to Northbridge (315). In one embodiment, PCI Express bus (318) connects Northbridge (315) to graphics controller (325). Graphics controller (325) connects to display device (330), such as a computer monitor.

Northbridge (315) and Southbridge (335) connect to each other using bus (319). In one embodiment, the bus is a Direct Media Interface (DMI) bus that transfers data at high speeds in each direction between Northbridge (315) and Southbridge (335). In another embodiment, a Peripheral Component Interconnect (PCI) bus connects the Northbridge and the Southbridge. Southbridge (335), also known as the I/O Controller Hub (ICH), is a chip that generally implements capabilities that operate at slower speeds than the capabilities provided by the Northbridge (315). Southbridge (335) typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM (396) and "legacy" I/O devices (398) (using a "super I/O" chip). The "legacy" I/O devices (398) can include, for example, serial and parallel ports, keyboard, mouse, and/or a floppy disk controller. Other components often included in Southbridge (335) include a Direct Memory Access (DMA) controller, a Programmable Interrupt Controller (PIC), and a storage device controller, which connects Southbridge (335) to nonvolatile storage device (385), such as a hard disk drive, using bus (384).

ExpressCard (355) is a slot that connects hot-pluggable devices to the information handling system. ExpressCard (355) supports both PCI Express and USB connectivity as it connects to Southbridge (335) using both the Universal Serial Bus (USB) the PCI Express bus. Southbridge (335) includes USB Controller (340) that provides USB connectivity to devices that connect to the USB. These devices include, but are not limited to, input devices, such as a camera (350) to support visual sensory input, a haptic receiver (348), keyboard and trackpad (344), and Bluetooth device (346), which provides for wireless personal area networks (PANs). USB Controller (340) also provides USB connectivity to other miscellaneous USB connected devices (342), such as a mouse, removable nonvolatile storage device (345), modems, network cards, ISDN connectors, fax, printers, USB hubs, and many other types of USB connected devices. While removable nonvolatile storage device (345) is shown as a USB-connected device, removable nonvolatile storage device (345) could be connected using a different interface, such as a Firewire interface, etc.

Wireless Local Area Network (LAN) device (375) connects to Southbridge (335) via the PCI or PCI Express bus (372). LAN device (375) typically implements one of the IEEE 802.11 standards for over-the-air modulation techniques to wireless communicate between system (300) and another computer system or device. Extensible Firmware Interface (EFI) manager (380) connects to Southbridge (335) via Serial Peripheral Interface (SPI) bus (378) and is used to interface between an operating system and platform firmware. Optical storage device (390) connects to Southbridge (335) using Serial ATA (SATA) bus (388). Serial ATA adapters and devices communicate over a high-speed serial link. The Serial ATA bus also connects Southbridge (335) to other forms of storage devices, such as hard disk drives. Audio circuitry (360), such as a sound card, connects to Southbridge (335) via bus (358). Audio circuitry (360) also provides functionality such as audio line-in and optical digital audio in port (362), optical digital output and headphone jack (364), internal speakers (366), and internal microphone (368). In one embodiment, the microphone (368) may be employed as a sensory input device and the speaker(s) may be employed as a sensory output device. Ethernet controller (370) connects to Southbridge (335) using a bus, such as the PCI or PCI Express bus. Ethernet controller (370) connects system (300) to a computer network, such as a Local Area Network (LAN), the Internet, and other public and private computer networks.

While FIG. 3 shows one system configuration (300), the system may take many forms, some of which are shown in FIG. 1. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory. In addition, the system need not necessarily embody the north bridge/south bridge controller architecture, as it will be appreciated that other architectures may also be employed.

Figure 4:
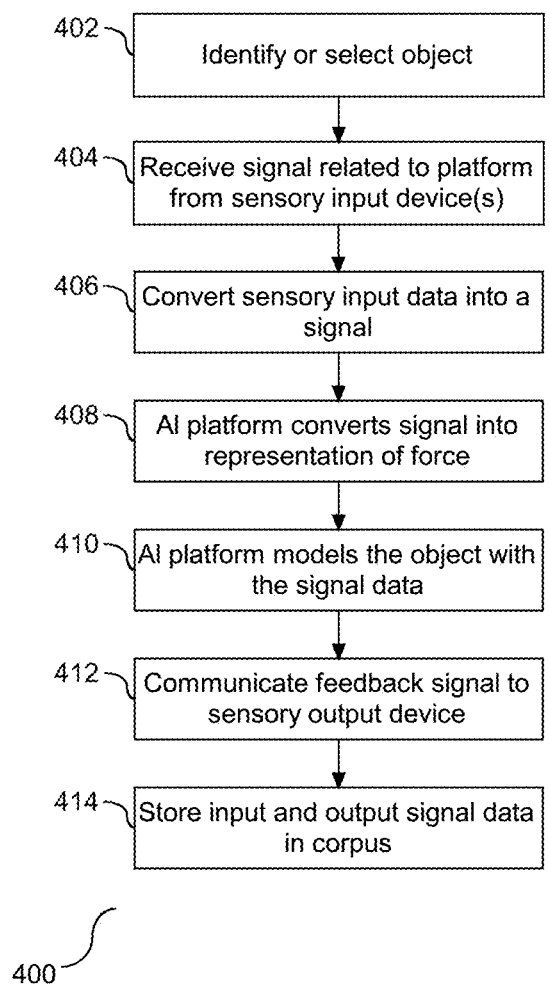
FIG. 4 depicts a flow chart diagrammatically illustrating a learning phase of the artificial intelligence platform.

To provide additional details for an improved understanding of selected embodiments of the present disclosure, reference is now made to FIG. 4 which diagrammatically illustrates a learning phase of the artificial intelligence platform in flow chart (400). In the example shown and described, a force is received as input and applied to a select object. Objects may vary in size, dimension, and material, with each of these parameters playing a role on application of input to be applied to the object. Prior to receiving the input, the object is identified or otherwise selected (402). In one embodiment, a menu of available objects is provided, and the object size, material, and/or dimensions are selected from the menu. In one embodiment, the size of the selected object is fixed or variable, with the variable object size allowing for selecting or identification of the object size. Following step (402), a signal related to input to the platform is received (404). As described above, input at step (404) may be received from one or more sensory input devices. In one embodiment, the input may be selected from a database or structure of stored values. With respect to use of a sensory input device, the sensory input is translated to a format conducive to an artificial intelligence platform. For example, the sensory input may be in an audio format and the decibel level of the received audio may be converted to a force proportional to the decibel level. In one embodiment, the sensory input may be in the form of a button configured to receive a force, with the length of time the button is actuated being the input value that is converted to a proportional force. Accordingly, the initial steps in the learning phase include selection of the subject, identified herein as the object, and receipt of sensory input.

Data received from the sensory input device, or in one embodiment, a combination of two or more sensory input devices, is converted into a signal (406). Following receipt of the signal (406), the artificial intelligence platform converts the signal into a representation of magnitude and direction of force to be applied to the selected object (408). In one embodiment, the converted signal produces an estimate of force to be applied to the selected object, with the force estimation including magnitude and direction. The artificial intelligence platform models the object together with the signal data (410). In one embodiment, the modeling at step (410) is directed at application of the force to a real-world object, as represented by the selected object. The modeling at step (410) creates feedback data and communicates a signal commensurate with the generated feedback to a sensory output device (412). In one embodiment, the sensory output is proportional to the feedback. A sensory output device in receipt of the sensory output may in the same sensory medium as the input or in one embodiment, a different sensory medium. In one embodiment, the feedback is returned to the feedback output device in real-time. In addition to communicating the feedback signal, feedback data is created and stored in the corpus (414). In one embodiment, the entry in the corpus includes object data and the input signal data is stored together with the feedback data. Accordingly, the learning phase provides feedback data and stores an entry in the corpus with details of the input and the associated feedback.

The learning phase shown and described in FIG. 4 is directed at both building the corpus and creating feedback in real-time. As the corpus grows with data entries, the artificial intelligence platform learns. The force applied to the identified object may result in movement of the object for a duration of time with the quantity of movement and time duration correlated to the input signal as applied to the object. In one embodiment, the size of the object is a factor in the movement and time duration of the movement. The sensory output received by the output device correlates to the duration and distance of object movement.

Figure 5:
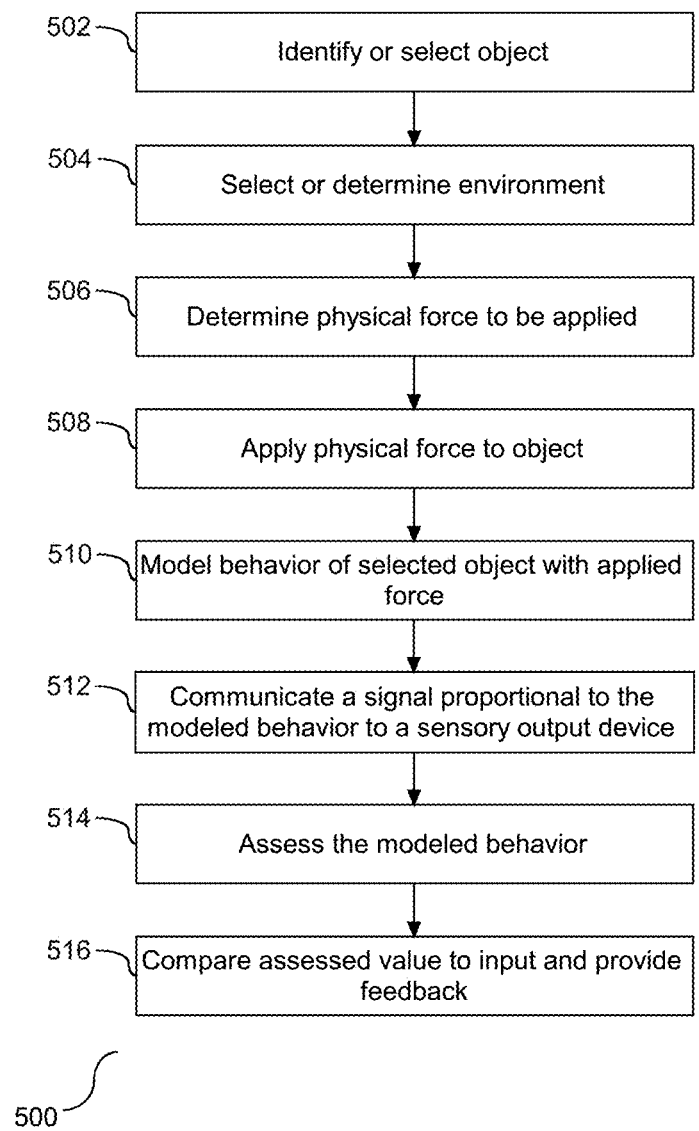
FIG. 5 depicts a flow chart illustrating an assessment phase of the artificial intelligence platform.

Referring to FIG. 5, a flow chart (500) is provided illustrating an assessment phase of the artificial intelligence platform. In one embodiment, the assessment phase is subsequent to the learning phase shown and described in FIG. 4. The assessment phase may be employed to predict how much was learned from the input and modeling that took place in the learning phase. As shown, the object for simulation is selected (502). In one embodiment, the object selection is automated, or in one embodiment, a menu of objects may be provided for selection. Similarly, the environment in which the selected or identified object is either determined or selected (504). A physical force, including magnitude and direction, is determined by the system (506) and applied to the selected object (508). In one embodiment, the object and force values are received from an entry in the corpus. Similarly, in one embodiment, the application of the physical force takes place in a virtual environment. Following step (508), behavior of the selected object together with the applied force is modeled (510). In the virtual environment, the object modeling may take place on a visual display. Similarly, in a sensory input and output environment, the object modeling may include communication of a signal proportional to the modeled behavior and may be communicated to an output sensory device (512). For example, in a non-visual environment, the modeled output may be haptic or auditory or a combination thereof. Following the objected modeling, an assessment of the force is conducted (514). The assessment provides a venue for interactive learning and to experience the force and its impact. The assessment may be in the form of a menu of force values for selection. Similarly, in one embodiment, the assessment is in the form of input from a sensory input device. After the assessment value is received, the artificial intelligence platform compares an assessed value to the input force and provides feedback (516). In one embodiment, the feedback is an indication of whether the assessed value is the same as the input force, or a degree of distance between the assessed value and the input force. Accordingly, the assessment phase provides a venue for interactive learning and experiencing the physical force and its impact.

Figure 6:
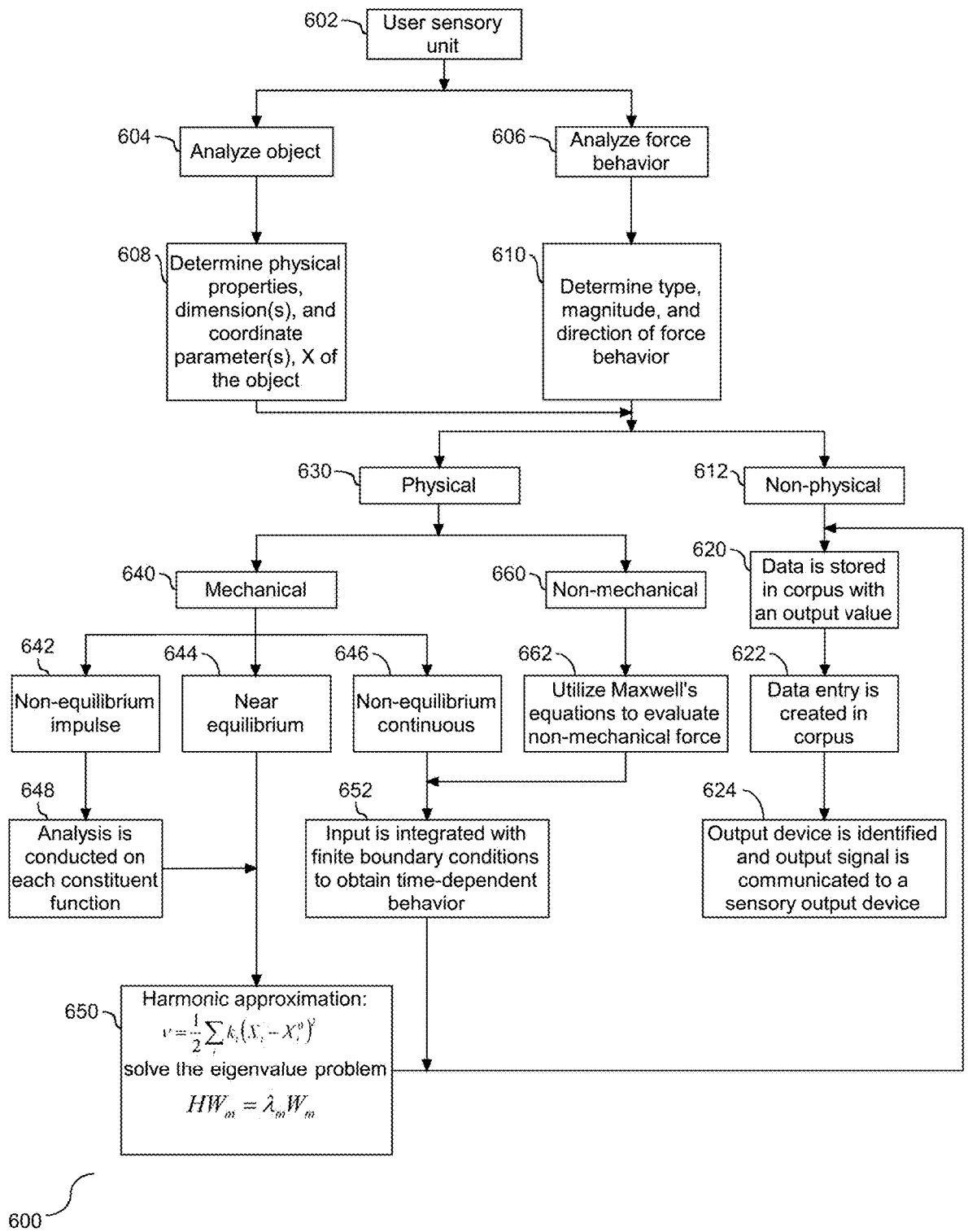
FIG. 6 depicts a block diagram illustrating a combination process for an artificial intelligence platform for physics based learning and assessment behavior modeling that incorporates aspects of the learning and assessment phases.

Referring to FIG. 6, a block diagram (600) is provided illustrating a combination process for an artificial intelligence platform for physics based learning and assessment behavior modeling that incorporates aspects of the learning phase shown in FIG. 4, and the assessment phase shown in FIG. 5. As shown, input to the system is in the form of sensory input (602). An associated sensory input device is provided to gather the input, such as a visual, acoustic, and/or auditory input. In one embodiment, an alternative or additional sensory input device and associated medium may be utilized. The sensory input at step (602) may be a single device and medium, or in one embodiment, a combination of two or more devices and associated mediums. In one embodiment, there may be two or more sensory input devices in the system, with the subject device being selectable. In the physics learning environment, the sensory input is converted to system input, which in one embodiment is converted to force or a force value, and applied to an object. Both the object and the force applied to the object are analyzed at (604) and (606), respectively. It is understood that the system may address and simulate application of force, or a combination of different forces, to an object. Similarly, in one embodiment and as demonstrated above, both the object and the force may be selectable components, and as such do not need to be preselected. With respect to the object, physical properties of the object, dimension(s) and coordinate parameter(s), X, are determined (608). In one embodiment, the object properties may be selected from a dataset. The force behavior analysis at (606) is based on the selected object and the sensory input. As demonstrated in FIGS. 4 and 5, the force behavior analysis includes type, magnitude, and direction (610). Accordingly, the object and the force are separate input components subject to evaluation.

As shown, the analysis of the object and the associated force at (608) and (610) are in parallel. In one embodiment, the analysis may be sequential so that the force analysis takes into consideration characteristics of the object. Following either step (608) and/or (610), the applied force is categorized as either physical (630) or non-physical (612). In one embodiment, the non-physical force (612) is associated with an emotional attribute of the object. For example, the object may exhibit an attribute that can be defined by a human annotation, such as happiness, sadness, etc. It is understood that even with non-physical force detection, the associated data, and in one embodiment metadata, is stored in the corpus together with a corresponding output value (620). The building of the corpus addresses the artificial intelligence component and enables the data in the corpus to grow and for the system to learn. At the same time, an entry is created in the corpus with data corresponding to the sensory input and the subject object that are both associated with the non-physical force (622). An output device is identified and an output signal is communicated to a sensory output device (624). The output device is selected or in one embodiment pre-selected. For example, the output device may be the same as the input device, or the same sensory medium as the input device. Similarly, in one embodiment, the output device is a different sensory medium than the input device. Accordingly, the corpus is employed to ascertain a corresponding value to the non-physical force, which is translated into a corresponding sensory output value.

As shown at step (610), the application of force may be determined to be physical (630). Force may be classified into different mediums. The example shown herein demonstrates classification as mechanical, electrical or magnetic, although such classifications should not be considered limiting. The sensory output medium may be selected by the system, or in one embodiment it is selected based on the input medium. As shown herein, the mechanical classification of the force (640) further separates the force into three sub-classifications, represented as non-equilibrium impulse (642), near equilibrium (644), and non-equilibrium continuous (646). For the non-equilibrium impulse sub-classification (642), a Fourier transformation is employ to decompose the impulse force into a series of harmonic functions, so that analysis may be conducted on each constituent function (648). Similarly, for the near equilibrium sub-classification (644), the following harmonic approximation is applied (650):

$$V = \frac{1}{2}\sum_i k_i(X_i - X_i^0)^2$$

and the following eigenvalue problem is solved:

$$HW_m = \lambda_m W_m,$$

where H is the second derivative of V. General motion of the system can be represented as a linear superposition of normal modes, $W_m$. As shown, after the Fourier transformation decomposition of the impulse force at step (648), the process flows into step (650) for resolution of the impulse. The third sub-classification, non-equilibrium continuous (646), applies a decomposition of the input into finite elements (652). More specifically, at step (652) the input is integrated with finite boundary conditions to obtain time-dependent behavior. In one embodiment, the following formulas are applied to the input to ascertain the time dependent behavior:

$$\vec{F} = -\nabla V$$

$$m = \frac{d^2 X_i(t)}{dt^2} = -\frac{dV}{dX_i}$$

Accordingly, as shown complex situations are modeled in one or more non-complex formats, which in one embodiment are computationally inexpensive, using superposition of fundamental modes and finite elements.

Following completion of the data processing at steps (650) or (652), the associated data, and in one embodiment metadata, is stored in the corpus together with the corresponding output value (620). The building of the corpus addresses the artificial intelligence component and enables the data in the corpus to grow and for the system to learn. At the same time, an entry is created in the corpus with data corresponding to the sensory input and the subject object (622). An output device is identified and an output signal is communicated to a sensory output device (624). The output device is selected or in one embodiment pre-selected. For example, the output device may be the same as the input device, or the same sensory medium as the input device. Similarly, in one embodiment, the output device is a different sensory medium than the input device. Accordingly, the evaluation of the received input classified as a physical force includes communication of the output to a selected or pre-selected sensory output device to enable an experience of a manifestation of the force and/or situation.

As shown and described at (630) the input force may be determine to be physical, but non-mechanical (660). For example, the input force may be classified in the field of electricity and magnetism. In this example, Maxwell's equations, if necessary, are utilized to evaluate the non-mechanical force (662). Following step (662), the process of the force evaluation proceeds to step (652) for decomposition into finite elements. Accordingly, non-mechanical forces may be evaluated, with complex modeling de-composed into fundamental modes.

Figure 7:
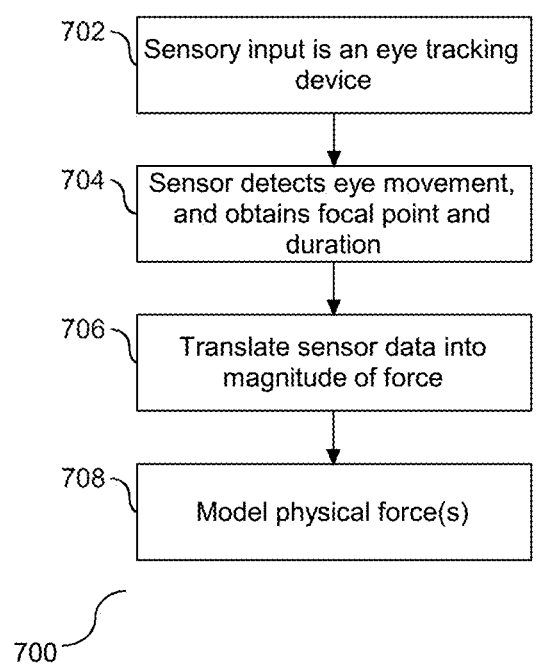
FIG. 7 depicts a flow diagram of an example learning situation.

As shown and described above, the sensory input and output devices, enables one to experience a manifestation of the force and/or situation. More specifically, the system shown and described herein is an interactive learning environment, which in one embodiment, is subject to evaluation and impact of force. In addition to the sensory output, a visual display may be employed for a visual depiction of the force and impact thereof. Referring to FIG. 7, a flow diagram (700) is provided of an example learning situation. Sensory input is in the form of an eye tracking device (702). An associated sensor detects eye movement and obtains a duration and focal point of the movement (704), which is then translated into magnitude of force (706). Modeling of a physical force takes place (708) to demonstrate the effects from different levels of physical force detection.

With respect to the example of FIG. 7, a non-equilibrium case of a low force value may be demonstrated with a ball or similar object being shown to move back and forth on a planar level, or for the ball to bounce up and down in a vertical direction. In another example, a non-equilibrium case of a high impulse force value may be demonstrated with the ball moving in a direction away from a starting point. Feedback in the form of output related to the force and the object is communicated. Examples of feedback include, but are not limited to, audio, visual, and haptic. For example, audio feedback may be conveyed by sounds of the ball bouncing, e.g. via a speaker, visual feedback may be conveyed via video presentation on a visual display, and haptic feedback may be conveyed by one or more vibrations corresponding to the bouncing motion of the ball. In one embodiment, input and corresponding output may be in the category of social and emotional, which is conveyed as a different category of force(s). In the social and emotional scenario, a situation is presented and a reaction is obtained as a response to the situation. For example, the reaction may demonstrate anger. The anger, or in one embodiment level of anger, is translated to a magnitude (706) and modeled (708). Accordingly, the sensory input and output support both physical and non-physical forms of force.

Figure 8:
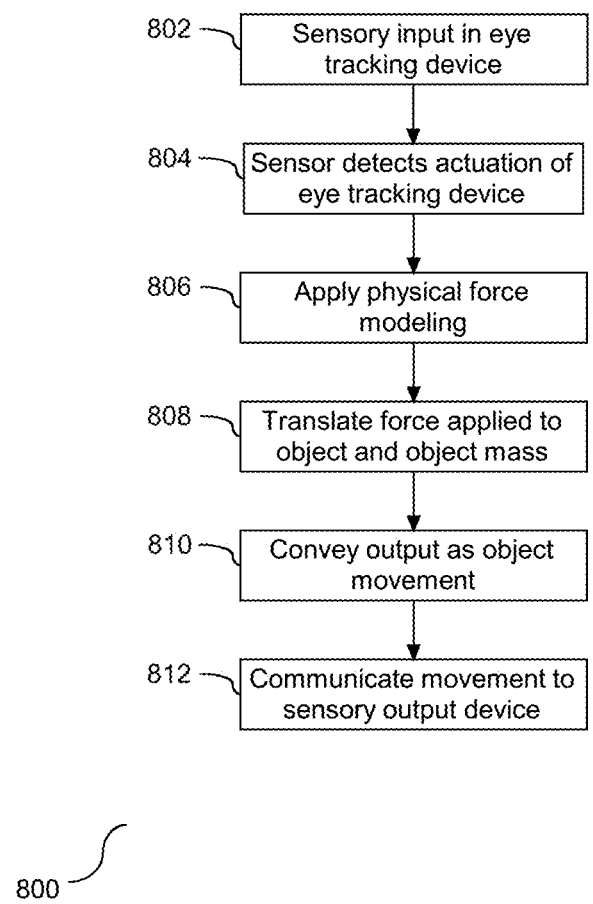
FIG. 8 depicts a flow diagram of an example learning situation with hearing impairment and experiencing sounds of a thrown or fallen object.

Referring to FIG. 8, a flow diagram (800) is provided of an example learning situation with hearing impairment and experiencing sounds of a thrown or fallen object. Sensory input is in the form of an eye tracking device (802). An object, such as a ball is detected as being seen by a subject via the eye tracking device (804). Force applied to the ball is demonstrated or gathered via a haptic input device. For example, the haptic device may employ a pressure sensor, a gyroscope, or an accelerometer to obtain force input. Physical force modeling of the input as applied to the ball is conducted (806). Force applied to the ball, and in one embodiment, the mass of the ball, contributes to determining features of the sound being created and translated (808). Output of the ball is conveyed in the form of ball movement (810). This movement is communicated to a sensory output device (812). For example, the ball movement may be conveyed in the form of vibrations of the output device corresponding to the features of the sound made by force applied to the ball. In another example, the system may convey the sound of glass breaking on different surfaces to a hearing impaired subject. It is understood that the sound of the glass breaking on a carpeted surface would be less than the sound of glass breaking on a hardwood floor. Haptic feedback may be used to show vibrations corresponding to the surface, for example, low or infrequent vibrations for the carpeted surface and high or frequent vibrations for the hardwood floor surface. Accordingly, the hearing impaired subject may experience force through a haptic output device.

Figure 9:
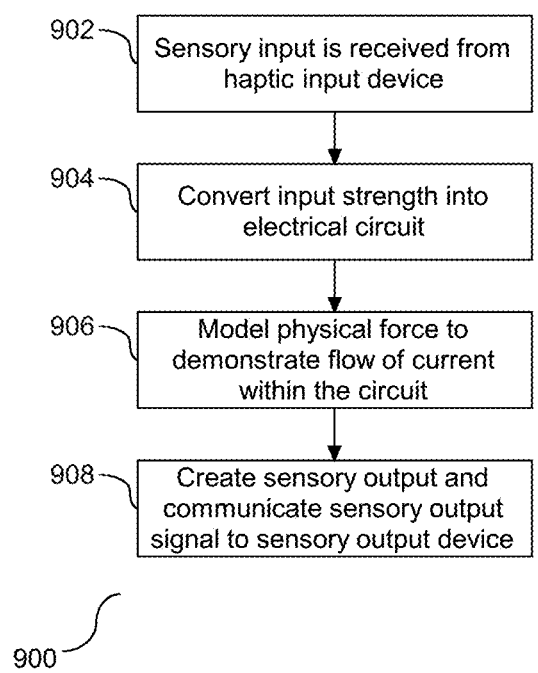
FIG. 9 depicts a flow diagram of an example learning situation with electricity.

Referring to FIG. 9, a flow diagram (900) is provided of an example learning situation with electricity. Sensory input is received in the form of haptic input (902). In this example, the input is directed at an electrical switch. The haptic input at step (902), and more specifically, the strength of the input, is converted to the amount of current or voltage within an associated electrical circuit (904). Physical force modeling is employed to demonstrate the flow of current, and specifically, the amount of current flow within the circuit (906). Sensory output directed at the amount of current flow is created in the form of audio, visual, or thermal output and a corresponding sensory output signal is communicated to a sensory output device (908). For example, audio output conveys sound made by excess voltage or current, with the decibel level of the sound proportional to the excess voltage or current. The visual output may be conveyed by completion of the circuit causing a light bulb to illuminate. Similarly, the thermal output may produce heat proportional to the current or voltage in the circuit. Accordingly, as demonstrate, electrical concepts may be conveyed through the sensory input and output device(s).

As shown in FIGS. 1-9, force calculations take place on a real-object and based on physical input. The sensory input and output device(s) provide tools for interaction with the subject and the associated force being evaluated. Although in some embodiments a single force is demonstrated, it is understood that multiple forces on a single object or multiple objects may be applied and simulated. Accordingly, the system and supporting methods provide an interactive learning and experiencing environment to articulate force and its associated impact.

Aspects of dynamic experiential learning shown and described in FIGS. 1-9, employ one or more functional tools to support balancing performance, sensory input, and sensory output, together with the artificial intelligence platform. Aspects of the functional tool(s), e.g. knowledge engine, and its associated functionality may be embodied in a computer system/server in a single location, or in one embodiment, may be configured in a cloud based system sharing computing resources. With references to FIG. 10, a block diagram (1000) is provided illustrating an example of a computer system/server (1002), hereinafter referred to as a host (1002) in communication with a cloud based support system, to implement the processes described above with respect to FIGS. 1-9. Host (1002) is operational with numerous other general purpose or special purpose computing system environments or configurations. Examples of well-known computing systems, environments, and/or configurations that may be suitable for use with host (1002) include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and file systems (e.g., distributed storage environments and distributed cloud computing environments) that include any of the above systems, devices, and their equivalents.

Host (1002) may be described in the general context of computer system-executable instructions, such as program modules, being executed by a computer system. Generally, program modules may include routines, programs, objects, components, logic, data structures, and so on that perform particular tasks or implement particular abstract data types. Host (1002) may be practiced in distributed cloud computing environments where tasks are performed by remote processing devices that are linked through a communications network. In a distributed cloud computing environment, program modules may be located in both local and remote computer system storage media including memory storage devices.

Figure 10:
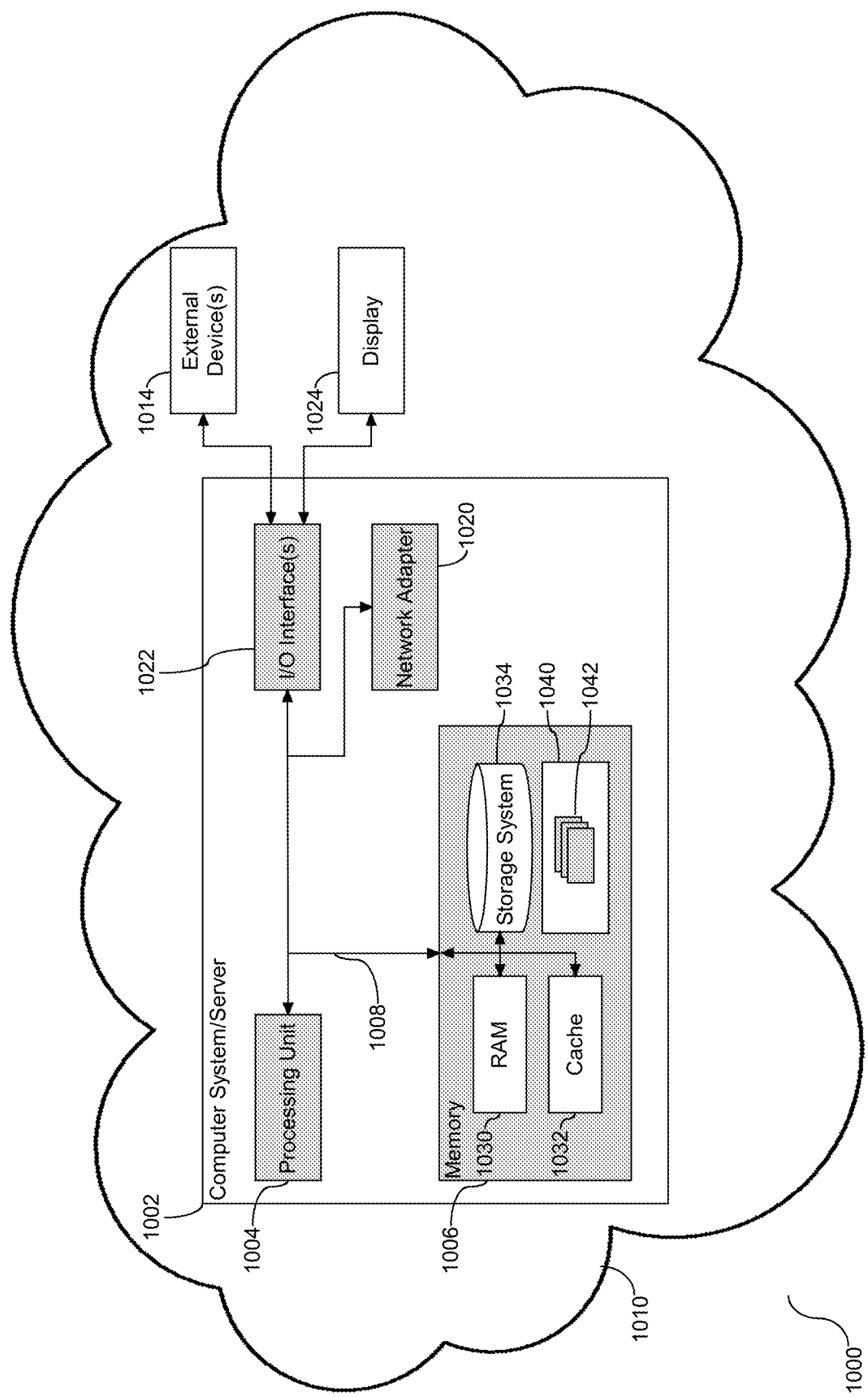
FIG. 10 is a block diagram illustrating an example of a computer system/server of a cloud based support system, to implement the process described above with respect to FIGS. 3-9.

As shown in FIG. 10, host (1002) is shown in the form of a general-purpose computing device. The components of host (1002) may include, but are not limited to, one or more processors or processing units (1004), a system memory (1006), and a bus (1008) that couples various system components including system memory (1006) to processor (1004). Bus (1008) represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Host (1002) typically includes a variety of computer system readable media. Such media may be any available media that is accessible by host (1002) and it includes both volatile and non-volatile media, removable and non-removable media.

Memory (1006) can include computer system readable media in the form of volatile memory, such as random access memory (RAM) (1030) and/or cache memory (1032). By way of example only, storage system (834) can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus (808) by one or more data media interfaces.

Program/utility (1040), having a set (at least one) of program modules (1042), may be stored in memory (1006) by way of example, and not limitation, as well as an operating system, one or more application programs, other program modules, and program data. Each of the operating systems, one or more application programs, other program modules, and program data or some combination thereof, may include an implementation of a networking environment. Program modules (1042) generally carry out the functions and/or methodologies of embodiments to data modeling directed at sensory input and output to experience a physical manifestation of an associated subject. For example, the set of program modules (1042) may include the modules configured as the knowledge engine, information handling system, detection engine, and analyze as described in FIG. 1.

Host (1002) may also communicate with one or more external devices (1014), such as a keyboard, a pointing device, a sensory input device, a sensory output device, etc.; a display (1024); one or more devices that enable a user to interact with host (1002); and/or any devices (e.g., network card, modem, etc.) that enable host (1002) to communicate with one or more other computing devices. Such communication can occur via Input/Output (I/O) interface(s) (1022). Still yet, host (1002) can communicate with one or more networks such as a local area network (LAN), a general wide area network (WAN), and/or a public network (e.g., the Internet) via network adapter (1020). As depicted, network adapter (1020) communicates with the other components of host (1002) via bus (1008). In one embodiment, a plurality of nodes of a distributed file system (not shown) is in communication with the host (1002) via the I/O interface (1022) or via the network adapter (1020). It should be understood that although not shown, other hardware and/or software components could be used in conjunction with host (1002). Examples, include, but are not limited to: microcode, device drivers, redundant processing units, external disk drive arrays, RAID systems, tape drives, and data archival storage systems, etc.

In this document, the terms "computer program medium," "computer usable medium," and "computer readable medium" are used to generally refer to media such as main memory (1006), including RAM (1030), cache (1032), and storage system (1034), such as a removable storage drive and a hard disk installed in a hard disk drive.

Computer programs (also called computer control logic) are stored in memory (1006). Computer programs may also be received via a communication interface, such as network adapter (1020). Such computer programs, when run, enable the computer system to perform the features of the present embodiments as discussed herein. In particular, the computer programs, when run, enable the processing unit (1004) to perform the features of the computer system. Accordingly, such computer programs represent controllers of the computer system.

In one embodiment, host (1002) is a node (1010) of a cloud computing environment. As is known in the art, cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models. Example of such characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher layer of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some layer of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load balancing between clouds).

A cloud computing environment is service oriented with a focus on statelessness, low coupling, modularity, and semantic interoperability. At the heart of cloud computing is an infrastructure comprising a network of interconnected nodes.

Figure 11:
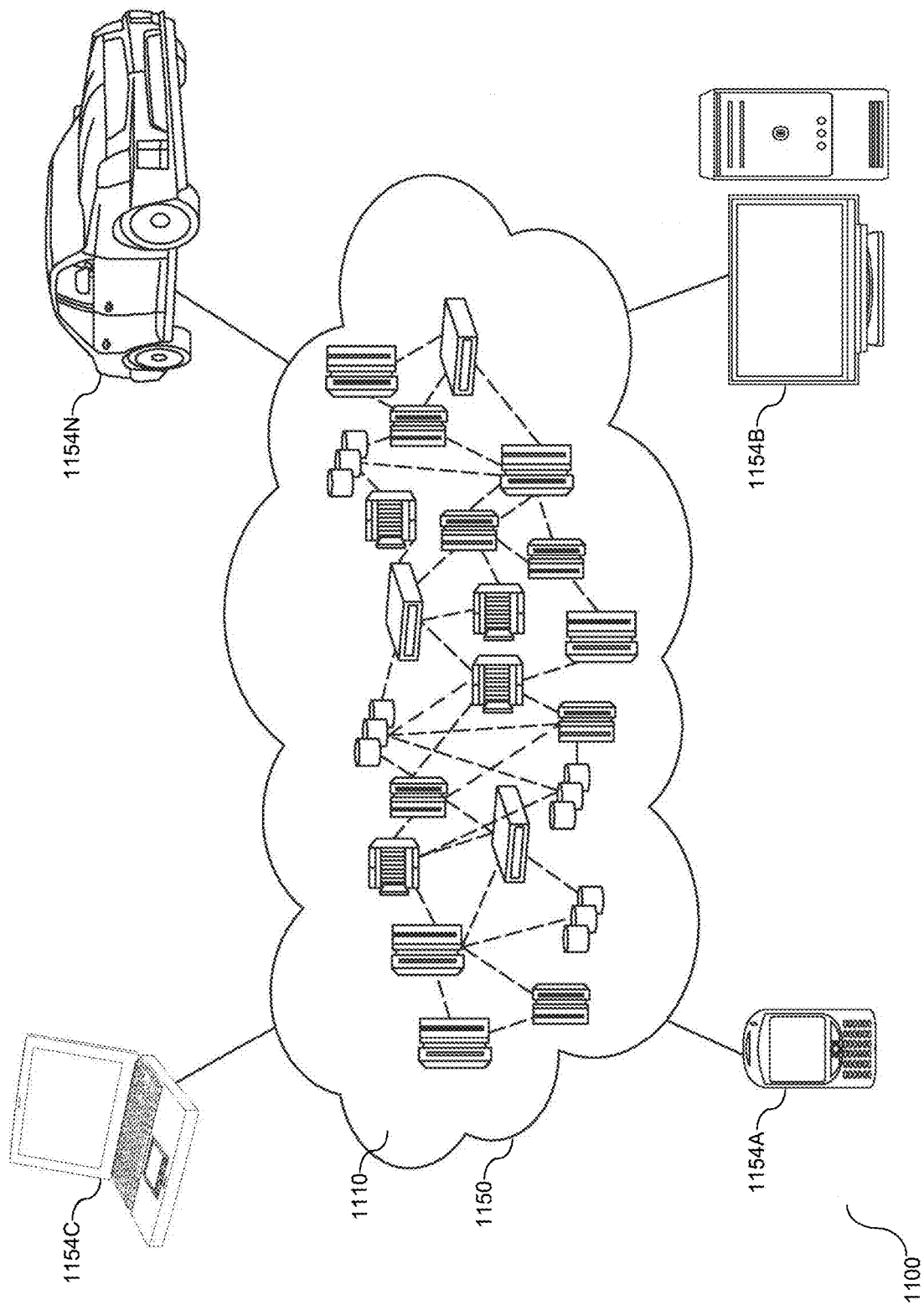
FIG. 11 depicts a block diagram illustrating a cloud computer environment.

Referring now to FIG. 11, an illustrative cloud computing network (1100). As shown, cloud computing network (1100) includes a cloud computing environment (1150) having one or more cloud computing nodes (1110) with which local computing devices used by cloud consumers may communicate. Examples of these local computing devices include, but are not limited to, personal digital assistant (PDA) or cellular telephone (1154A), desktop computer (1154B), laptop computer (1154C), and/or automobile computer system (1154N). Individual nodes within nodes (1110) may further communicate with one another. They may be grouped (not shown) physically or virtually, in one or more networks, such as Private, Community, Public, or Hybrid clouds as described hereinabove, or a combination thereof. This allows cloud computing environment (1100) to offer infrastructure, platforms and/or software as services for which a cloud consumer does not need to maintain resources on a local computing device. It is understood that the types of computing devices (1154A-N) shown in FIG. 11 are intended to be illustrative only and that the cloud computing environment (1150) can communicate with any type of computerized device over any type of network and/or network addressable connection (e.g., using a web browser).

Figure 12:
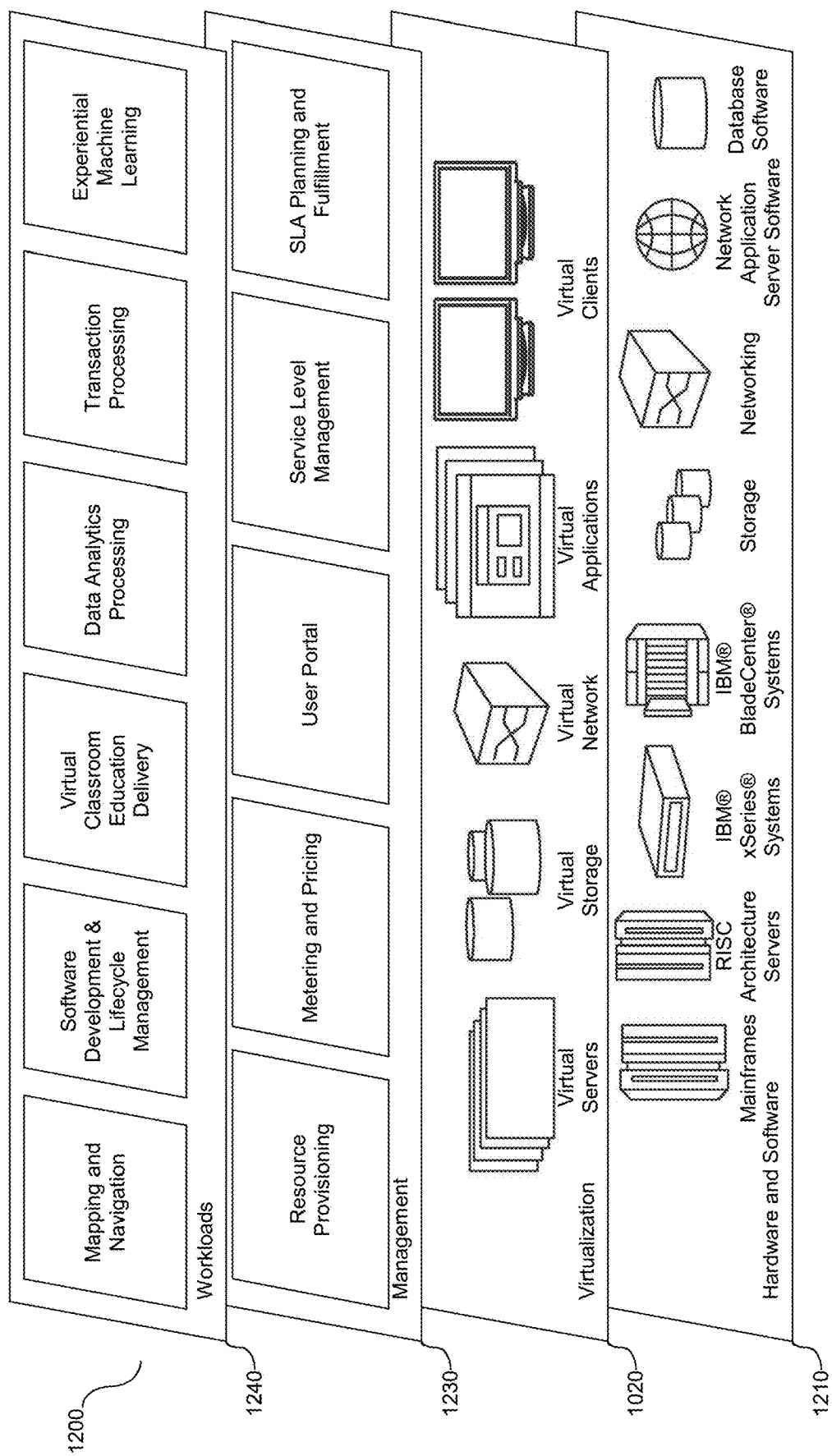
FIG. 12 depicts a block diagram illustrating a set of functional abstraction model layers provided by the cloud computing environment.

Referring now to FIG. 12, a set of functional abstraction layers (1200) provided by the cloud computing network of FIG. 10 is shown. It should be understood in advance that the components, layers, and functions shown in FIG. 12 are intended to be illustrative only, and the embodiments are not limited thereto. As depicted, the following layers and corresponding functions are provided: hardware and software layer (1210), virtualization layer (1220), management layer (1230), and workload layer (1240). The hardware and software layer (1210) includes hardware and software components. Examples of hardware components include mainframes, in one example IBM® zSeries® systems; RISC (Reduced Instruction Set Computer) architecture based servers, in one example IBM pSeries® systems; IBM xSeries® systems; IBM BladeCenter® systems; storage devices; networks and networking components. Examples of software components include network application server software, in one example IBM WebSphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide).

Virtualization layer (1220) provides an abstraction layer from which the following examples of virtual entities may be provided: virtual servers; virtual storage; virtual networks, including virtual private networks; virtual applications and operating systems; and virtual clients.

In one example, management layer (1230) may provide the following functions: resource provisioning, metering and pricing, user portal, service layer management, and SLA planning and fulfillment. Resource provisioning provides dynamic procurement of computing resources and other resources that are utilized to perform tasks within the cloud computing environment. Metering and pricing provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service layer management provides cloud computing resource allocation and management such that required service layers are met. Service Layer Agreement (SLA) planning and fulfillment provides pre-arrangement for, and procurement of, cloud computing resources for which a future requirement is anticipated in accordance with an SLA.

Workloads layer (1240) provides examples of functionality for which the cloud computing environment may be utilized. Examples of workloads and functions which may be provided from this layer include, but are not limited to: mapping and navigation; software development and lifecycle management; virtual classroom education delivery; data analytics processing; transaction processing; and experiential machine learning.

It will be appreciated that there is disclosed herein a system, method, apparatus, and computer program product for evaluating and processing sensory input, modeling the input, translating the input into a force, and ascertaining and communicating a sensory output. As disclosed, the system, method, apparatus, and computer program product apply artificial intelligence processing to the sensory input to contribute to identification of a corresponding sensory output.

While particular embodiments of the present embodiments have been shown and described, it will be obvious to those skilled in the art that, based upon the teachings herein, changes and modifications may be made without departing from these embodiments and their broader aspects. Therefore, the appended claims are to encompass within their scope all such changes and modifications as are within the true spirit and scope of the embodiments. Furthermore, it is to be understood that the embodiments are solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to embodiments containing only one such element, even when the same claim includes the introductory phrases "one or more" or "at least one" and indefinite articles such as "a" or "an"; the same holds true for the use in the claims of definite articles.

The present embodiments may be a system, a method, and/or a computer program product. In addition, selected aspects of the present embodiments may take the form of an entirely hardware embodiment, an entirely software embodiment (including firmware, resident software, micro-code, etc.) or an embodiment combining software and/or hardware aspects that may all generally be referred to herein as a "circuit," "module" or "system." Furthermore, aspects of the present embodiments may take the form of computer program product embodied in a computer readable storage medium (or media) having computer readable program instructions thereon for causing a processor to carry out aspects of the present embodiments. Thus embodied, the disclosed system, a method, and/or a computer program product are operative to improve the functionality and operation of a machine learning model.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a dynamic or static random access memory (RAM), a read-only memory (ROM), an erasable programmable read-only memory (EPROM or Flash memory), a magnetic storage device, a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present embodiments may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server or cluster of servers. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present embodiments.

Aspects of the present embodiments are described herein with reference to flowchart illustrations and/or block diagrams of methods, apparatus (systems), and computer program products according to the embodiments. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be appreciated that, although specific embodiments have been described herein for purposes of illustration, various modifications may be made without departing from the spirit and scope of the embodiments. In particular, the artificial intelligence platform and associated processing may be carried out by different computing platforms or across multiple devices. Furthermore, the data storage and/or corpus may be localized, remote, or spread across multiple systems. Accordingly, the scope of protection of these embodiments is limited only by the following claims and their equivalents.

What is claimed is:

1. A system comprising:
   a processing unit operatively coupled to memory;
   an artificial intelligence platform in communication with the processing unit;
   a knowledge engine in communication with the processing unit to simulate interaction with an object upon activation by the artificial intelligence platform, including:
   receive sensory input data from an input sensory device, the sensory input data representing a physical force;
   translate the sensory input data into one or more values corresponding to the physical force, including separate the physical force into one or more classifications, the one or more classifications comprising a non-equilibrium impulse attribute, a near equilibrium attribute, a non-equilibrium continuous attribute, or a combination thereof;
   in real-time, analyze a virtual impact of the sensory input data on a virtual representation of a physical object having one or more physical characteristics, including analyze the one or more values as applied to the virtual representation of the physical object, taking into consideration effects of the one or more physical characteristics on the virtual impact, and model an expected behavior of the virtual representation of the physical object in response to the virtual impact to simulate a non-virtual interaction of the physical force on the physical object;
   create an assessment commensurate with the model;
   present the assessment and receive an assessment response;
   compare the assessment response to a corpus of solutions, each solution including an entry of force magnitude and one or more object parameters, and identify at least one solution in the corpus proximal to the assessment response;

generate sensory output feedback based on the comparison;
communicate the generated sensory output feedback to a sensory output device for a physical manifestation of the sensory output feedback; and
the sensory output device to physically manifest the sensory output feedback.

2. The system of claim 1, wherein the assessment response includes a solicitation of a first response prediction, and further comprising the knowledge engine to assess proximity of the first response prediction to the identified at least one solution.

3. The system of claim 2, further comprising the knowledge engine to generate sensory feedback based on proximity of the first response prediction comparison to the identified at least one solution, and to physically convey the manifestation of the feedback to the sensory output device.

4. The system of claim 3, further comprising the knowledge engine to populate the corpus with the first response prediction and to associate the identified at least one solution.

5. The system of claim 4, further comprising the knowledge engine to solicit a second response prediction, including assess proximity of the second response prediction to the first response prediction.

6. The system of claim 1, wherein the knowledge engine is further configured to:
decompose the non-equilibrium impulse property into a series of harmonic functions;
apply a harmonic approximation to the decomposed non-equilibrium impulse property and the near equilibrium property to represent motion as a linear superposition;
apply a decomposition of the non-equilibrium continuous property into finite elements to obtain time-dependent behavior; and
capture and store the linear superposition and finite elements.

7. A computer program product to support sensory data in an artificial intelligence platform, comprising a computer readable storage device having program code embodied therewith, the program code executable by a processing unit to:
receive sensory input data from an input sensory device, the sensory input data representing a physical force;
translate the sensory input data into one or more values corresponding to the physical force, including separate the physical force into one or more classifications, the one or more classifications comprising a non-equilibrium impulse attribute, a near equilibrium attribute, a non-equilibrium continuous attribute, or a combination thereof;
in real-time, analyze a virtual impact of the sensory input on a virtual representation of a physical object having one or more physical characteristics, including analyze the one or more values as applied to the virtual representation of the physical object, taking into consideration effects of the one or more physical characteristics on the virtual impact, and model an expected behavior of the virtual representation of the physical object in response to the virtual impact to simulate a non-virtual interaction of the physical force on the physical object;
create an assessment commensurate with the model;
present the assessment and receive an assessment response;
compare the assessment response to a corpus of solutions, each solution including an entry of force magnitude and one or more object parameters, and identify at least one solution in the corpus proximal to the assessment response;
generate sensory output feedback based on the comparison;
communicate the generated sensory output feedback to a sensory output device for a physical manifestation of the sensory output feedback; and
the sensory output device to physically manifest the sensory output feedback.

8. The computer program product of claim 7, wherein the assessment response includes a solicitation of a first response prediction, and further includes proximity of the first response prediction to the identified at least one solution.

9. The computer program product of claim 8, further comprising the processing unit to generate sensory feedback based on proximity of the first response prediction comparison to the identified at least one solution, and to physically convey the manifestation of the feedback to the sensory output device.

10. The computer program product of claim 9, further comprising the processing unit to populate the corpus with the first response prediction and to associate the identified at least one solution.

11. The computer program product of claim 10, further comprising the processing unit to solicit a second response prediction, including assessing proximity of the second response prediction to the first response prediction.

12. The computer program product of claim 6, further comprising program code to:
decompose the non-equilibrium impulse property into a series of harmonic functions;
apply a harmonic approximation to the decomposed non-equilibrium impulse property and the near equilibrium property to represent motion as a linear superposition;
apply a decomposition of the non-equilibrium continuous property into finite elements to obtain time-dependent behavior; and
capture and store the linear superposition and finite elements.

13. A method comprising:
receiving sensory input data from an input sensory device, the sensory input data representing a physical force;
translating the sensory input data into one or more values corresponding to the physical force, including separating the physical force into one or more classifications, the one or more classifications comprising a non-equilibrium impulse attribute, a near equilibrium attribute, a non-equilibrium continuous attribute, or a combination thereof;
in real-time, analyzing a virtual impact of the sensory input data on a virtual representation of a physical object having one or more physical characteristics, including analyzing the one or more values as applied to the virtual representation of the physical object, taking into consideration effects of the one or more physical characteristics on the virtual impact, and modeling an expected behavior of the virtual representation of the physical object in response to the virtual impact to simulate a non-virtual interaction of the physical force on the physical object;
creating an assessment commensurate with the model;
presenting the assessment and receiving an assessment response;
comparing the assessment response to a corpus of solutions, each solution including an entry of force magnitude and one or more object parameters, and identifying at least one solution in the corpus proximal to the assessment response;

generating sensory output feedback based on the comparison;

communicating the generated sensory output feedback to a sensory output device for a physically manifestation of the sensory output feedback; and the sensory output device physically manifesting the sensory output feedback.

14. The method of claim 1, wherein the assessment response includes soliciting a first response prediction, and further comprising assessing proximity of the first response prediction to the identified at least one solution.

15. The method of claim 14, further comprising generating sensory feedback based on proximity of the first response prediction comparison to the identified at least one solution, and physically conveying the manifestation of the feedback to the sensory output device.

16. The method of claim 15, further comprising populating the corpus with the first response prediction and associating the identified at least one solution.

17. The method of claim 16, further comprising soliciting a second response prediction, including assessing proximity of the second response prediction to the first response prediction.

18. The method of claim 13, further comprising:

decomposing the non-equilibrium impulse property into a series of harmonic functions;

applying a harmonic approximation to the decomposed non-equilibrium impulse property and the near equilibrium property to represent motion as a linear superposition;

applying a decomposition of the non-equilibrium continuous property into finite elements to obtain time-dependent behavior; and capturing and store the linear superposition and finite elements.

* * * * *